United States Patent
Min et al.

(10) Patent No.: US 8,856,719 B2
(45) Date of Patent: Oct. 7, 2014

(54) METHOD FOR CIRCUIT SIMULATION

(75) Inventors: Seonguk Min, Uiwang-si (KR); Sangho Park, Anyang-si (KR); Yeoil Yun, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/616,511

(22) Filed: Sep. 14, 2012

(65) Prior Publication Data

US 2013/0086539 A1  Apr. 4, 2013

(30) Foreign Application Priority Data

Sep. 30, 2011 (KR) .................. 10-2011-0099919

(51) Int. Cl.
 G06F 11/22 (2006.01)
 G06F 17/50 (2006.01)
(52) U.S. Cl.
 CPC .................................. *G06F 17/5036* (2013.01)
 USPC .......................................... 716/136; 716/133
(58) Field of Classification Search
 USPC ........................................................ 716/136
 See application file for complete search history.

(56) References Cited

U.S. PATENT DOCUMENTS

| 2005/0096888 A1* | 5/2005 | Ismail .............................. 703/2 |
| 2006/0041417 A1* | 2/2006 | Palladino ....................... 703/14 |
| 2010/0201400 A1* | 8/2010 | Nardone et al. ............. 326/101 |

FOREIGN PATENT DOCUMENTS

| JP | 2000-322464 A | 11/2000 |
| JP | 2001-338007 A | 12/2001 |
| JP | 2002-163322 A | 6/2002 |
| JP | 2006-329824 A | 12/2006 |
| JP | 2009-211356 A | 9/2009 |
| JP | 2009-295007 A | 12/2009 |

* cited by examiner

*Primary Examiner* — Paul Dinh
*Assistant Examiner* — Bryce Aisaka
(74) *Attorney, Agent, or Firm* — Lee & Morse, P.C.

(57) ABSTRACT

A circuit simulation method for checking a circuit error is disclosed. The method may include generating a netlist with respect to a designed circuit, simulating an operation of the designed circuit using the generated netlist, and checking an error of the designed circuit using the generated netlist and using a waveform generated when performing the simulation.

24 Claims, 18 Drawing Sheets

Fig. 4

| Power supply-ground path | Circuit element and node information included in power supply-ground path | | |
|---|---|---|---|
| Power supply-ground path1 | P1(s:Vcc / d:ND2 / g:ND1) | N1(s:GND / d:ND2 / g:ND1) | |
| Power supply-ground path2 | P2(s:Vcc / d:ND1 / g:ND2) | N2(s:GND / d:ND1 / g:ND2) | |
| Power supply-ground path3 | P4(s:Vcc / d:ND4 / g:ND3) | N4(s:GND / d:ND4 / g:ND3) | |
| Power supply-ground path4 | P5(s:Vcc / d:ND3 / g:ND4) | N5(s:GND / d:ND3 / g:ND4) | |
| Power supply-ground path5 | P1(s:Vcc / d:ND2 / g:ND1) | P3(s:ND2 / d:ND3 / g:ND5) | N3(s:GND / d:ND3 / g:ND6) |
| Power supply-ground path6 | P1(s:Vcc / d:ND2 / g:ND1) | P3(s:ND2 / d:ND3 / g:ND5) | N5(s:GND / d:ND3 / g:ND4) |
| Power supply-ground path7 | P5(s:Vcc / d:ND3 / g:ND4) | N3(s:GND / d:ND3 / g:ND6) | |

Fig. 6A

| Node | Logical Value1 | Logical Value2 | Logical Value3 | Logical Value4 | Logical Value5 | Logical Value6 | Logical Value7 | Logical Value8 |
|---|---|---|---|---|---|---|---|---|
| ND1 | 0 | X | 0 | 0 | X | 0 | X | X |
| ND5 | 0 | 0 | X | 0 | X | X | 0 | X |
| ND6 | 1 | 1 | 1 | X | 1 | X | X | X |

Fig. 6B

| Node | Logical Value1 | Logical Value2 | Logical Value3 | Logical Value4 | Logical Value5 | Logical Value6 | Logical Value7 | Logical Value8 |
|---|---|---|---|---|---|---|---|---|
| ND1 | 0 | X | 0 | 0 | X | 0 | X | X |
| ND5 | 0 | 0 | X | 0 | X | X | 0 | X |
| ND6 | 0 | 0 | 0 | X | 0 | X | X | X |

Fig. 6C

| Node | Logical Value1 | Logical Value2 | Logical Value3 | Logical Value4 | Logical Value5 | Logical Value6 | Logical Value7 | Logical Value8 |
|------|------|------|------|------|------|------|------|------|
| ND1 | 1 | X | 1 | 1 | X | 1 | X | X |
| ND5 | 1 | 1 | X | 1 | X | X | 1 | X |
| ND6 | 1 | 1 | 1 | X | 1 | X | X | X |

Fig. 10

| Node | Path information connected to node and element information included in the path information | |
|---|---|---|
| ND3 | P1(s:Vcc / d:ND2 / g:ND1) | P3(s:ND2 / d:ND3 / g:ND4) |
| | N1(s:GND / d:ND2 / g:ND1) | P3(s:ND2 / d:ND3 / g:ND4) |
| | N3(s:GND / d:ND3 / g:ND5) | |

| | |
|---|---|
| | Path 1 |
| | Path 2 |
| | Path 3 |

Fig. 12A

| Node | Logical Value1 | Logical Value2 | Logical Value3 |
|---|---|---|---|
| ND1 | 1 | 0 | X |
| ND4 | 1 | 1 | 1 |
| ND5 | 0 | 0 | 0 |

Fig. 12B

| Node | Logical Value1 | Logical Value2 | Logical Value3 | Logical Value4 | Logical Value5 |
|---|---|---|---|---|---|
| ND1 | 1 | X | 0 | 1 | 1 |
| ND4 | 1 | 1 | 1 | 0 | X |
| ND5 | 1 | 1 | 1 | 1 | 1 |

| Node | Logical Value1 | Logical Value2 | Logical Value3 | Logical Value4 | Logical Value5 |
|---|---|---|---|---|---|
| ND1 | 1 | 0 | X | 0 | 0 |
| ND4 | 0 | 0 | 0 | 1 | X |
| ND5 | 0 | 0 | 0 | 0 | 0 |

METHOD FOR CIRCUIT SIMULATION

CROSS-REFERENCE TO RELATED APPLICATIONS

This U.S. non-provisional patent application claims priority under 35 U.S.C. §119 of Korean Patent Application No. 10-2011-0099919, filed on Sep. 30, 2011, the entire contents of which are hereby incorporated by reference.

BACKGROUND

1. Field

The present inventive concept herein relates to methods for circuit simulation and, more particularly, to a method for circuit simulation that can check an error of circuit.

2. Description of the Related Art

A circuit simulation tool is generally used to design an integrated circuit. SPICE (Simulation Program with Integrated Circuit Emphasis) is one circuit simulation tool that is generally used to design an integrated circuit. A circuit that will be embodied in the form of integrated circuit is described through a netlist extracted from a schematic tool. That is, a connection relation between circuit elements that are interconnected is described by the netlist. The circuit elements include a basic circuit element, e.g., a resistor, a capacitor, an inductor, a voltage source, a current source, and so forth. Also, in addition to the circuit elements described above, the netlist provides connection relationships between more complicated circuit elements, e.g., a N-channel field effect transistor, a P-channel field effect transistor, a metal line, and so forth.

After the designed circuit is described through the netlist, a designer simulates an operation of the designed circuit using SPICE. If the designed circuit does not accurately operate just as the designer intended when simulating the designed circuit, a design of the circuit is changed. In this manner, a circuit is simulated and whether operation of the circuit is suitable or not is determined before the circuit is produced.

SUMMARY

One or more embodiments of the inventive concept provide a simulation method for checking an error of a circuit. The simulation method may include generating a netlist with respect to a designed circuit, simulating an operation of the designed circuit using the generated netlist, and checking an error of the designed circuit using the generated netlist and a waveform being generated when performing the simulation.

One or more embodiments of the inventive concept also provide a simulation method. The simulation method may include generating a netlist including circuit element information of designed circuit and connection information of the circuit elements, simulating an operation of the designed circuit using the generated netlist, generating a waveform made by a logical value with respect to nodes of the designed circuit as a result of the simulation, and checking an error of the designed circuit using the generated check target list and the generated waveform.

One or more embodiments of the inventive concept also provide a circuit simulation method. The circuit simulation method may include generating a netlist with respect to a designed circuit, simulating an operation of the designed circuit using the generated netlist, generating a waveform having discrete values as a result of simulating, and checking an error of the designed circuit using the generated waveform.

BRIEF DESCRIPTION OF THE DRAWINGS

Features will become apparent to those of ordinary skill in the art by describing in detail exemplary embodiments with reference to the attached drawings in which:

FIGS. 3 and 4 illustrate how a check target list generated in the check target list generation operation of FIG. 2.

FIG. 6A illustrates conditions under which a DC path of the power supply-ground path of FIG. 5A is generated.

FIG. 6B illustrates conditions under which a DC path of the power supply-ground path of FIG. 5B is generated.

FIG. 6C illustrates conditions under which a DC path of the power supply-ground path of FIG. 5C is generated.

FIGS. 9 and 10 illustrate how a check target list is generated in the check target list generation operation of FIG. 8.

FIG. 12A illustrates conditions under which a third node in FIG. 11A becomes a floating node.

FIG. 12B illustrates conditions under which a third node in FIG. 11B becomes a floating node.

DETAILED DESCRIPTION

Figure 1:
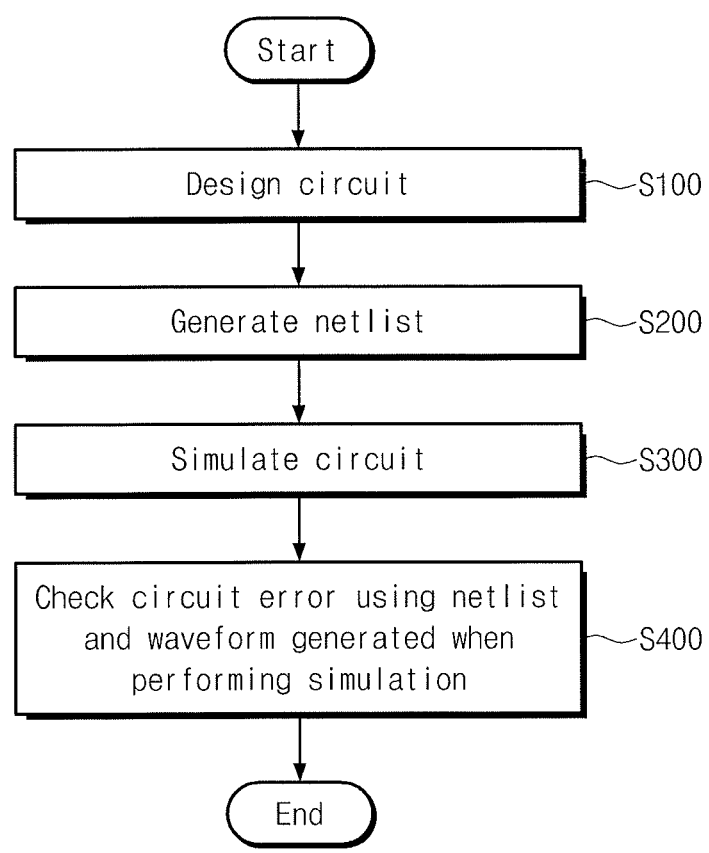
FIG. 1 illustrates a flow chart of a method of checking a circuit in accordance with some embodiments of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

Hereinafter, embodiments of the inventive concept are described in detail with reference to drawings.

FIG. 1 is a flow chart illustrating a method of checking a circuit in accordance with some embodiments of the inventive concept.

First, a schematic circuit is designed using a schematic tool (operation S100). For example, circuit elements, e.g., a resistor, a capacitor, an inductor, a voltage source, a current source, a transistor, and so forth, are arranged and interconnected through a schematic tool to design a schematic circuit. A schematic circuit means that a relation of arrangement and connection of those circuit elements is schematized. After that, each circuit element included in the schematic circuit may be designed by patterns of material layers, e.g., a conductive layer, a semiconductor layer, an insulating layer, and so forth. Then, a layout in which patterns are vertically and horizontally arranged is designed and an integrated circuit performing desired functions is designed by repeating a process of depositing and patterning each material layer on the basis of the layout.

When a schematic circuit of integrated circuit is designed through a schematic tool, a netlist may be generated from the schematic tool (operation S200). Herein, the netlist is a file extracted from a schematic tool to perform a simulation or LVS (layout versus schematic to check whether a layout as drawn is the same as the original schematic circuit or not) after a design of integrated circuit is completed. The netlist represents a connection relation between circuit elements included in a schematic circuit, a connection relation between functional blocks constituted by circuit elements, and node information according to a connection of circuit elements.

After a netlist is generated, operation of the schematic circuit designed through a simulation program, such as SPICE, is simulated (operation S300). That is, a schematic circuit is simulated using a netlist. If the designed schematic circuit does not accurately operate just as the designer intended, the design of the circuit is changed. In this manner, the schematic circuit is simulated and whether an operation of integrated circuit is suitable or not is determined before the integrated circuit is produced.

When a schematic circuit is simulated, a waveform made by node (for example, a connection node, a power supply node, a ground node, a gate node of transistor, and so forth) values of schematic circuit may be generated. The node values of the waveform are represented by, for example, a logic "1", a logic "0", a logic "X" meaning an intermediate state and a logic "Z" meaning a floating state.

A circuit error is checked using a netlist for performing a simulation and a waveform resulting from the simulation (operation S400). Also, a circuit error may be checked according to check control information to control a circuit error check. According to an error check method in accordance with some embodiments of the inventive concept, since the method uses a netlist for performing a simulation and a digital waveform, i.e., a waveform having discrete values, a speed of circuit error check becomes high and various error checks may be performed.

Various types of errors may be checked according with desired designs parameters. According to some embodiments of the inventive concept, an error check is performed on a power to ground path. For example, whether a DC path in which a power supply is connected to a ground is generated or not is checked. This check is called a "DC path check". Alternatively or additionally, an error check is performed on each node of the circuits. For example, whether nodes are in a floating state or not is checked. The check is called a "floating node check". Hereinafter, the DC path check method and the floating node check method will be described in detail with reference to the drawings.

Figure 2:
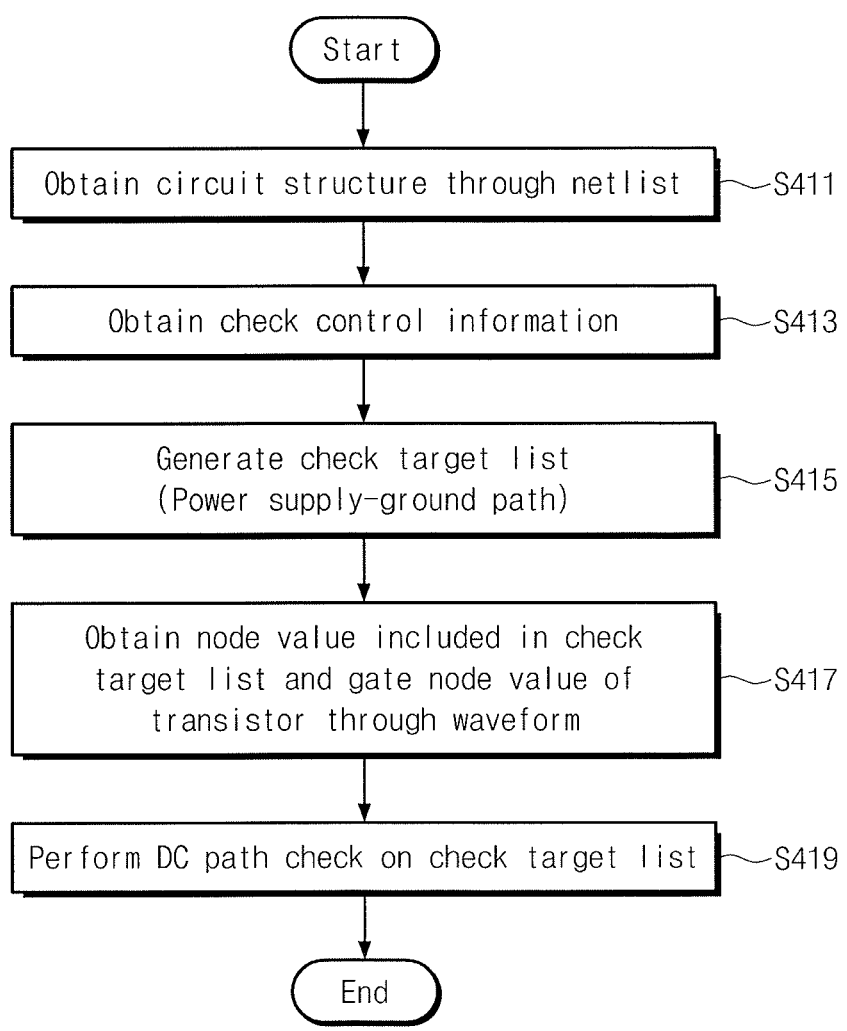
FIG. 2 illustrates a flow chart of a DC path check method in the error check operation of FIG. 1.

FIG. 2 is a flow chart illustrating the DC path check method in the error check operation of FIG. 1.

First, in operation S411, a circuit structure is obtained through a netlist to perform a DC path check. As described above, the netlist represents a connection relation between circuit elements included in a schematic circuit, a connection relation between functional blocks constituted by circuit elements, and node information according to a connection of circuit elements. Thus, a circuit structure is obtained from the netlist.

In operation S413, check control information is obtained to control the DC path check. The check control information includes information on a check start node and a check end node. For example, if information on a power supply node and a ground node is obtained through the netlist, through the check control information, a specific power supply node may be designated a check start node and a specific ground node may be designated a check end node. Also, the check control information includes information to judge an error. For example, the check control information includes a current judgment value to judge a current flowing through a power supply-ground path, time information to designate a stabilizing time before judging whether a DC path is generated or not, and a judgment value to select one of DC paths when a DC path is detected several times in one power supply-ground path.

In operation S415, a check target list is generated. The check target list means a list about a power supply-ground path of circuit. The check target list includes circuit node information and node information included the power supply-ground path. Also, the check target list is generated on a basis of a check start node and a check end node obtained through check control information. The check target list will be in detail through FIGS. 3 and 4.

In operation S417, a logical value included in the check target list and a logical value of gate node of transistor included in the check target list are obtained through a waveform generated after a circuit is simulated. As described above, a node value of waveform is represented by a logic "1", a logic "0", a logic "X" meaning an intermediate state and a logic "Z" meaning a floating state.

Lastly, in operation S419, a DC path check is performed on a check target list. The DC path check is performed by checking a waveform corresponding to a path included in the check target list. The DC path check method will be described in detail with reference to FIG. 7.

Figure 3:
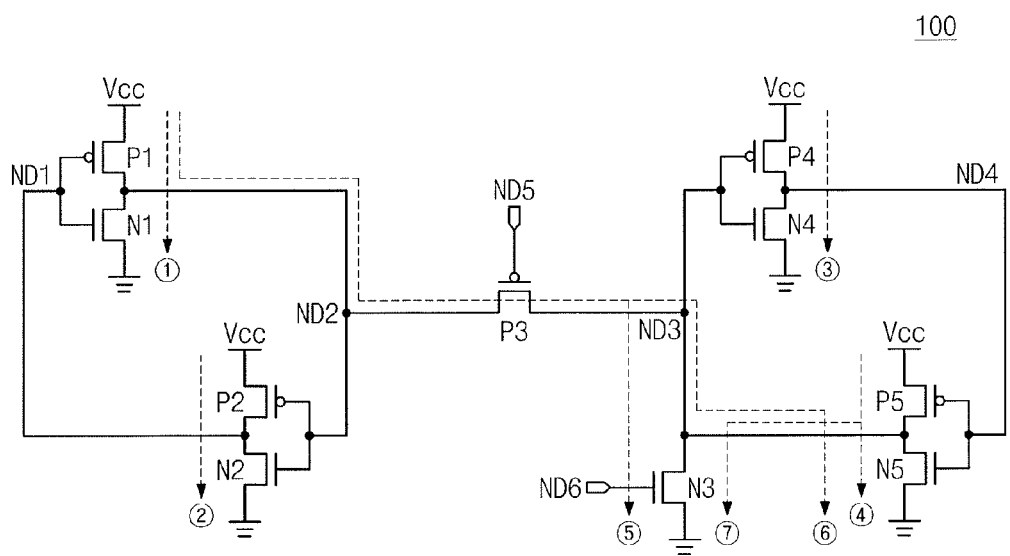

FIGS. 3 and 4 are drawings for describing a check target list generated through the check target list generation operation S415 of FIG. 2. Hereinafter, some embodiments for describing the inventive concept are provided and a circuit constituted by transistors is used to describe the DC path check method. The circuits that will be described in detail may include PMOS transistors and/or NMOS transistors. However, the inventive concept is not limited thereto.

Referring to FIG. 3, a check target circuit 100 includes a plurality of PMOS transistors (P1 through P5) and a plurality of NMOS transistors (N1 through N5). The transistors of the check target list 100 are connected to one another through a plurality of nodes (ND1 through ND6). An interconnection relation of the circuit elements of the check target circuit 100 is obtained through a netlist as described above.

The check target circuit 100 includes seven power supply-ground paths. Referring to FIG. 3, the seven power supply-ground paths are represented by symbols ①-⑦. Referring to FIG. 4, the power supply-ground paths represented by the symbols ①-⑦ are generated as a check target list. A power supply-ground path 1 is formed through a first PMOS transistor (P1) and a first NMOS transistor (N1). A power supply-ground path 2 is formed through a second PMOS transistor (P2) and a second NMOS transistor (N2). A power supply-ground path 3 is formed through a fourth PMOS transistor (P4) and a fourth NMOS transistor (N4). A power supply-ground path 4 is formed through a fifth PMOS transistor (P5)

and a fifth NMOS transistor (N5). A power supply-ground path 5 is formed through the first PMOS transistor (P1), a third PMOS (P3), and a third NMOS transistor (N3). A power supply-ground path 6 is formed through the first PMOS transistor (P1), the third PMOS (P3), and the fifth NMOS transistor (N5). A power supply-ground path 7 is formed through the fifth PMOS transistor (P5) and the third NMOS transistor (N3).

The check target list includes circuit element information and node information of each of the power supply-ground paths (power supply-ground path 1 through power supply-ground path 7). For brevity of description, the power supply-ground path 1 is described as an example. The power supply-ground path 1 is formed through the first PMOS transistor (P1) and the first NMOS transistor (N1). A source of the first PMOS transistor (P1) is connected to a power supply Vcc, a drain of the first PMOS transistor (P1) is connected to a second node ND2, and a gate of the first PMOS transistor (P1) is connected to a first node (ND1). A source of the first NMOS transistor (N1) is connected to a ground GND, a drain of the first NMOS transistor (N1) is connected to the second node ND2, and a gate of the first NMOS transistor (N1) is connected to the first node ND1. The check target list includes the information described above. A check target list for checking a DC path using the same method is generated. Hereinafter, examples of generation of DC path will be described in detail with reference to FIGS. 5A through 6C.

Firstly, an example circuit including PMOS transistors and NMOS transistors is described with reference to FIGS. 5A and 6A.

Figure 5A:
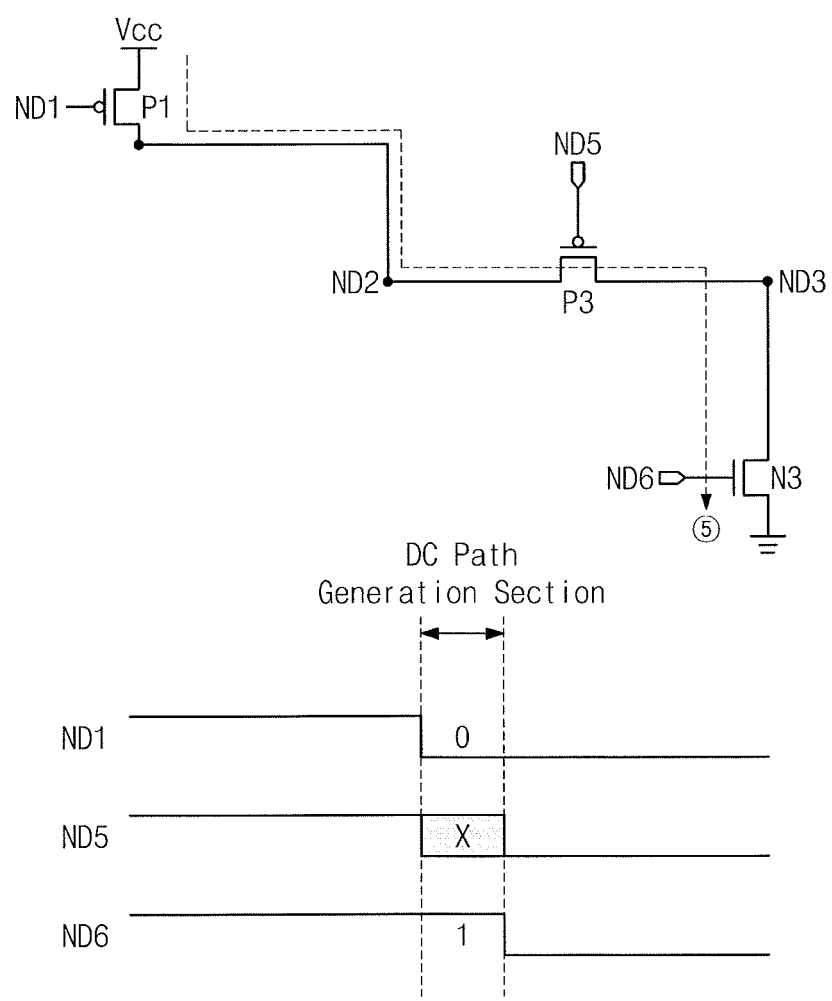
FIGS. 5A, 5B, and 5C illustrate examples of DC path generation of a power supply-ground path.

FIG. 5A illustrates an example of generation of DC path of power supply-ground path. For brevity of description, in FIG. 5A, it is exemplarily described that a DC path is generated in the power supply-ground path 5 of FIG. 3.

The power supply-ground path 5 of FIG. 5A is formed through the first PMOS transistor (P1), the third PMOS transistor (P3), and the third NMOS transistor (N3). The source of the first PMOS transistor (P1) is connected to the power supply Vcc, the drain of the first PMOS transistor (P1) is connected to the second node ND2, and the gate of the first PMOS transistor (P1) is connected to the first node ND1. A source of the third PMOS transistor (P3) is connected to the second node ND2, a drain of the third PMOS transistor (P3) is connected to a third node ND3, and a gate of the third PMOS transistor (P3) is connected to a fifth node ND5. A source of the third NMOS transistor (N3) is connected to a ground GND, a drain of the third NMOS transistor (N3) is connected to the third node ND3, and a gate of the third NMOS transistor (N3) is connected to a sixth node ND6.

As illustrated in FIG. 5A, when a logical value of the first node ND1 is a logic "0", a logical value of the fifth node ND5 is a logic "X" (a logical value indicating an intermediate state of a logic "1" and a logic "0") and a logical value of sixth node ND6 is a logic "1", a DC path in which a power supply is coupled to a ground is generated in the power supply-ground path 5 of FIG. 5A. That is, when the first PMOS transistor P1 is turned on by the logic "0" of the first node N1, the third PMOS transistor (P3) is slightly or fully turned on by the logic "X" of the fifth node ND5, and the third NMOS transistor N3 is turned on by the logic "1" of the sixth node ND6, a DC path that a power supply is coupled to a ground is generated in the power supply-ground path 5 of FIG. 5A.

The DC path may be generated due to a slope, delay, etc., of voltages applied to gates of the transistors P1, P3, and N3. If an unintended DC path is generated in a power supply-ground path, an unnecessary current may be consumed. Thus, an error is detected through a circuit check and the detected error is corrected.

FIG. 6A describes conditions under which DC path of the power supply-ground path of FIG. 5A is generated. Referring to FIG. 6A, logical values of the nodes ND1, ND5, and ND6 connected to each gate of the transistors P1, P3 and N3 forming the power supply-ground path 5 of FIG. 5A are illustrated.

If the nodes ND1, ND5, and ND6 connected to gates of the transistors P1, P3, and N3 included in the power supply-ground path 5 of FIG. 5A have logical values illustrated in FIG. 6A respectively, a DC path is generated in the power supply-ground path 5 of FIG. 5A. That is, if the transistors P1, P3 and N3 are slightly or fully turned on by logical values of the nodes ND1, ND5, and ND6 connected to gates of the transistors P1, P3, and N3 respectively, a DC path is generated in the power supply-ground path 5 of FIG. 5A.

For example, when, as illustrated for a first logical value in FIG. 6A, a logical value of first node ND1 is a logic "0", a logical value of fifth node ND5 is a logic "0", and a logical value of sixth node ND6 is a logic "1", the transistors P1, P3, and N3 are turned on and a DC path that a power supply is coupled to a ground is generated in the power supply-ground path 5 of FIG. 5A. Also, the DC path may be generated in a power supply-ground path 5 of FIG. 5A by each of second through eighth logical values of FIG. 6A.

Secondly, an example circuit including only PMOS transistors is described with reference to FIGS. 5B and 6B.

Figure 5B:
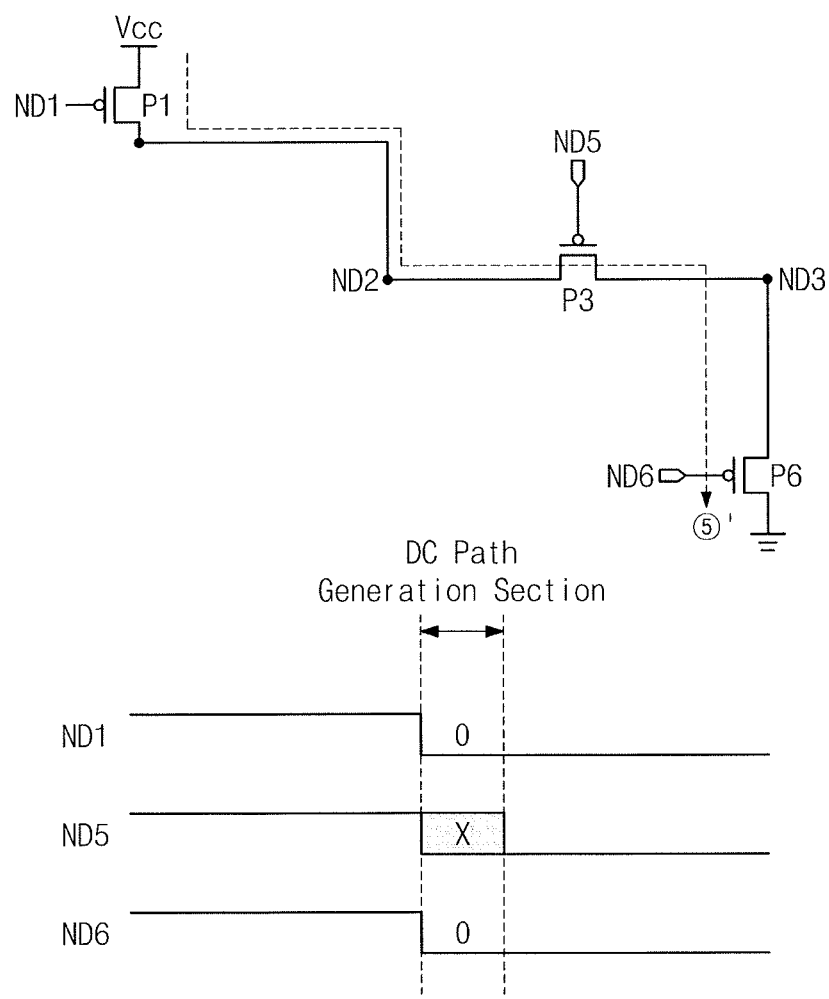

FIG. 5B illustrates an example of generation of DC path of power supply-ground path. For brevity of description, in FIG. 5B, it is exemplarily described that a DC path is generated in a path 5' in which the third NMOS transistor (N3) of the power supply-ground path 5 of FIG. 3 is replaced with a sixth PMOS transistor (P6).

The power supply-ground path 5' of FIG. 5B is formed through the first PMOS transistor (P1), the third PMOS transistor (P3), and the sixth PMOS transistor (P6). The source of the first PMOS transistor (P1) is connected to the power supply Vcc, the drain of the first PMOS transistor (P1) is connected to the second node ND2, and the gate of the first PMOS transistor (P1) is connected to the first node ND1. The source of the third PMOS transistor (P3) is connected to the second node ND2, the drain of the third PMOS transistor (P3) is connected to a third node ND3, and the gate of the third PMOS transistor (P3) is connected to a fifth node ND5. A source of the sixth PMOS transistor (P6) is connected to the third node ND3, a drain of the sixth PMOS transistor (P6) is connected to a ground GND, and a gate of the sixth PMOS transistor (P6) is connected to a sixth node ND6.

As illustrated in FIG. 5B, when a logical value of the first node ND1 is a logic "0", a logical value of the fifth node ND5 is a logic "X" (a logical value indicating an intermediate state of a logic "1" and a logic "0"), and a logical value of sixth node ND6 is a logic "0", a DC path in which a power supply is coupled to a ground is generated in the power supply-ground path 5' of FIG. 5B. That is, when the first PMOS transistor P1 is turned on by the logic "0" of the first node N1, the third PMOS transistor (P3) is slightly or fully turned on by the logic "X" of the fifth node ND5, and the sixth PMOS transistor P6 is turned on by the logic "0" of the sixth node ND6, a DC path that a power supply is coupled to a ground is generated in the power supply-ground path 5' of FIG. 5B.

The DC path may be generated due to a slope, delay, etc. of voltages applied to gates of the transistors P1, P3, and P6. If an unintended DC path is generated in a power supply-ground path, an unnecessary current may be consumed. Thus, an error is detected through a circuit check and the detected error is corrected.

FIG. 6B illustrates conditions under which DC path of the power supply-ground path 5' of FIG. 5B is generated. Referring to FIG. 6B, logical values of the nodes ND1, ND5, and ND6 connected to each gate of the transistors P1, P3 and P6 forming the power supply-ground path 5' of FIG. 5B are illustrated.

If the nodes ND1, ND5, and ND6 connected to gates of the transistors P1, P3, and P6 included in the power supply-ground path 5' of FIG. 5B have logical values illustrated in FIG. 6B respectively, a DC path is generated in the power supply-ground 5' of FIG. 5B. That is, if the transistors P1, P3, and P6 are slightly or fully turned on by logical values of the nodes ND1, ND5, and ND6 connected to gates of the transistors P1, P3, and P6 respectively, a DC path is generated in the power supply-ground 5 of FIG. 5B.

For example, when, as illustrated as a first logical value in FIG. 6B, a logical value of first node ND1 is a logic "0", a logical value of fifth node ND5 is a logic "0", and a logical value of sixth node ND6 is a logic "0", the transistors P1, P3, and P6 are turned on and a DC path that a power supply is coupled to a ground is generated in the power supply-ground path 5' of FIG. 5B. Also, the DC path may be generated in a power supply-ground path 5' of FIG. 5B by each of second through eighth logical values of FIG. 6B.

Lastly, an example circuit including only NMOS transistors is described with reference to FIGS. 5C and 6C.

Figure 5C:
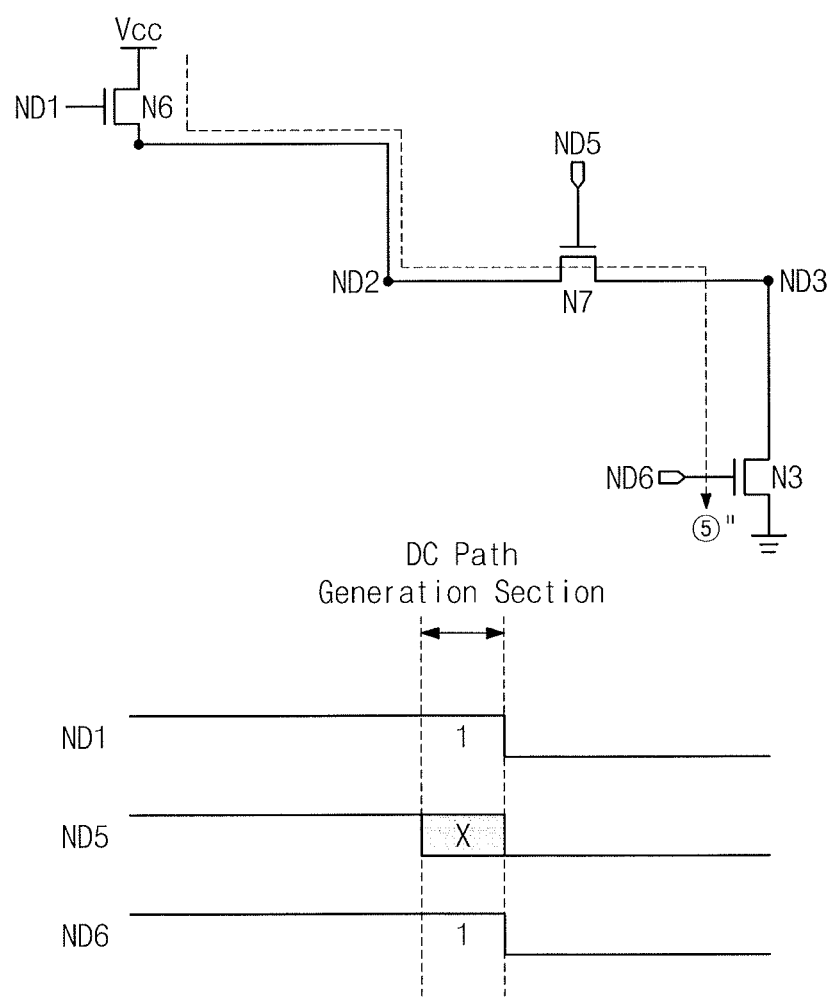

FIG. 5C illustrates an example of generation of DC path of power supply-ground path. For brevity of description, in FIG. 5B, it is exemplarily described that a DC path is generated in a path 5" in which the first PMOS transistor (P1) and the third PMOS transistor (P3) of the power supply-ground path 5 of FIG. 3 are replaced with a sixth NMOS transistor (N6) and a seventh NMOS transistor (N7), respectively.

The power supply-ground path 5" of FIG. 5C is formed through the sixth NMOS transistor (N6), the seventh NMOS transistor (N7), and the third NMOS transistor (N3). A drain of the sixth NMOS transistor (N6) is connected to the power supply Vcc, a source of the sixth NMOS transistor (N6) is connected to the second node ND2, and a gate of the sixth NMOS transistor (N6) is connected to the first node ND1. A drain of the seventh NMOS transistor (N7) is connected to the second node ND2, a source of the seventh NMOS transistor (N7) is connected to the third node ND3, and a gate of the seventh NMOS transistor (N7) is connected to the fifth node ND5. The drain of the third NMOS transistor (N3) is connected to the third node ND3, the source of the third NMOS transistor (N3) is connected to a ground GND, and the gate of the third NMOS transistor (N3) is connected to a sixth node ND6.

As illustrated in FIG. 5C, when a logical value of the first node ND1 is a logic "1", a logical value of the fifth node ND5 is a logic "X" (a logical value indicating an intermediate state of a logic "1" and a logic "0"), and a logical value of sixth node ND6 is a logic "1", a DC path in which a power supply is coupled to a ground is generated in the power supply-ground path 5" of FIG. 5C. That is, when the sixth NMOS transistor (N6) is turned on by the logic "1" of the first node N1, the seventh NMOS transistor (N7) is slightly or fully turned on by the logic "X" of the fifth node ND5, and the third NMOS transistor (N3) is turned on by the logic "1" of the sixth node ND6, a DC path that a power supply is coupled to a ground is generated in the power supply-ground path 5" of FIG. 5C.

The DC path may be generated due to a slope, delay, etc. of voltages applied to gates of the transistors N6, N7, and N3. If an unintended DC path is generated in a power supply-ground path, an unnecessary current may be consumed. Thus, an error is detected through a circuit check and the detected error is corrected.

FIG. 6C illustrates conditions under which DC path of the power supply-ground path 5" of FIG. 5C is generated. Referring to FIG. 6C, logical values of the nodes ND1, ND5, and ND6 connected to each gate of the transistors N6, N7 and N3 forming the power supply-ground path 5" of FIG. 5C are illustrated.

If the nodes ND1, ND5, and ND6 connected to gates of the transistors N6, N7, and N3 included in the power supply-ground path 5" of FIG. 5C have logical values illustrated in FIG. 6C respectively, a DC path is generated in the power supply-ground 5" of FIG. 5C. That is, if the transistors N6, N7, and N3 are slightly or fully turned on by logical values of the nodes ND1, ND5, and ND6 connected to gates of the transistors N6, N7, and N3 respectively, a DC path is generated in the power supply-ground path 5" of FIG. 5C.

For example, when, as illustrated as a first logical value in FIG. 6C, a logical value of first node ND1 is a logic "1", a logical value of fifth node ND5 is a logic "1", and a logical value of sixth node ND6 is a logic "1", the transistors N6, N7, and N3 are turned on, and a DC path that a power supply is coupled to a ground is generated in the power supply-ground path 5" of FIG. 5C. Also, the DC path may be generated in a power supply-ground path 5" of FIG. 5C by each of second through eighth logical values of FIG. 6C.

Figure 7:
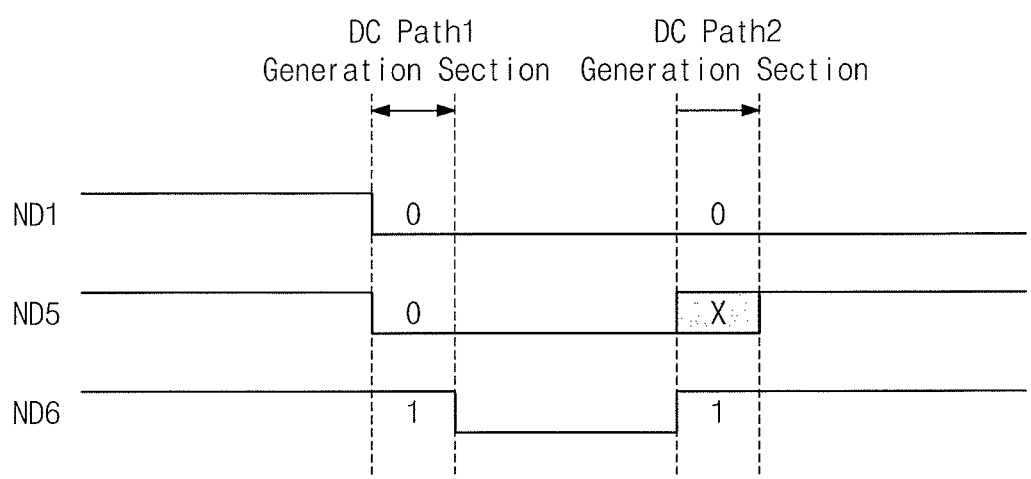
FIG. 7 illustrates a check method in DC path check operation of FIG. 2.

FIG. 7 illustrates a check method in DC path check operation S419 of FIG. 2. For brevity of description, the check method in DC path check operation S419 of FIG. 2 is described by the power supply-ground path 5 included in the check target list by example. Referring to FIG. 7, among waveforms generated after performing a circuit simulation, a part of waveform of the power supply-ground path 5 of FIG. 5 is illustrated.

In the DC path check operation S419, a DC path check may be performed by checking all the combinations of logical values causing a DC path from a waveform corresponding to the power supply-ground 5. That is, the DC path check operation is an operation determining whether each of the nodes ND1, ND5, and ND6 of the power supply-ground path 5 has the logical values (first through eighth logical values) illustrated in FIG. 6A in a waveform corresponding to the power supply-ground path 5.

In a DC path check operation, a DC path may be detected several times in one power supply-ground path. In this case, one of the DC paths detected several times is selected as a check result through check control information obtained in operation S413 of FIG. 2. Referring to FIG. 7, two DC paths (DC path 1 and DC path 2) are illustrated as being detected in a waveform corresponding to the power supply-ground 5. In this case, according to check control information, only one of the DC path 1 and the DC path 2 may be selected as a DC path check result. In other words, once a path has been determined to match a logical value of the target check list, the checking may be stopped.

Although a condition under which a DC path is generated in the power supply-ground path 5 and a method of checking a DC path in the power supply-ground path 5 are described through FIGS. 5A and 7 as an illustration, the same method of checking a DC path may be applied to power supply-ground paths of FIG. 3 (power supply-ground path 1 through power supply-ground path 7).

Figure 8:
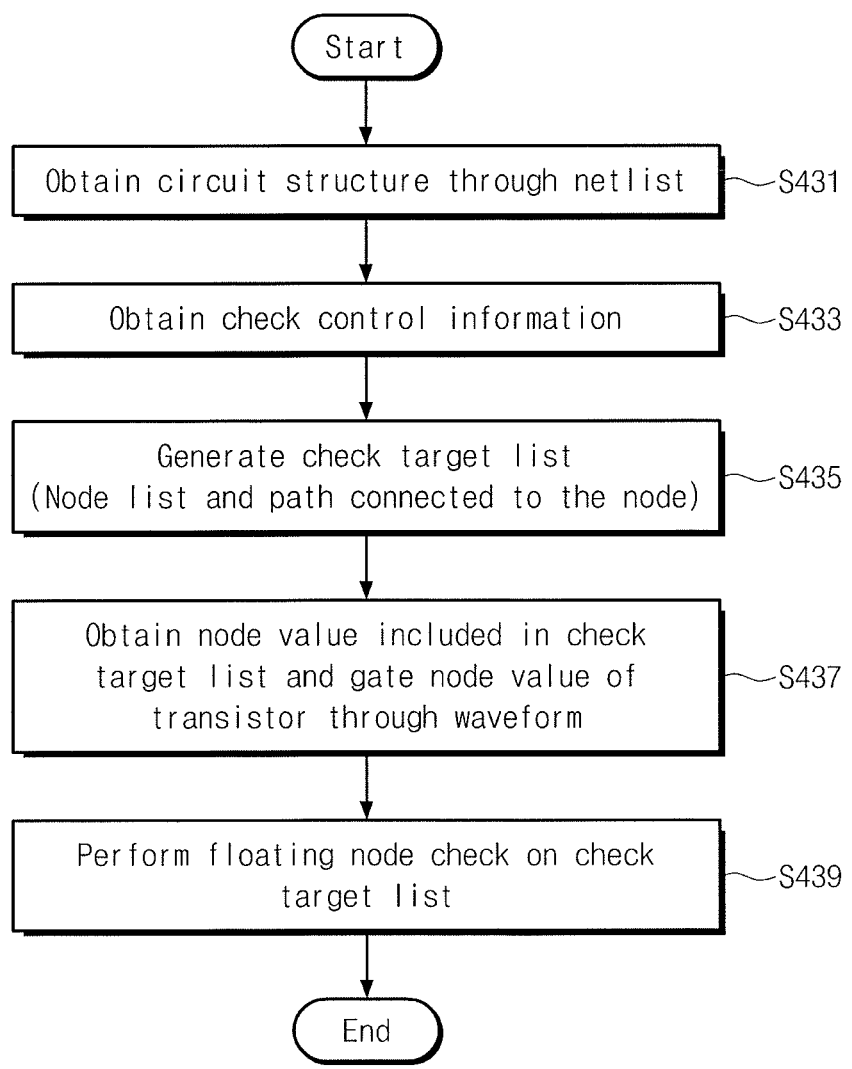
FIG. 8 illustrates a flow chart of a method of checking a floating node in the error check operation of FIG. 1.

FIG. 8 is a flow chart illustrating a method of checking a floating node in the error check operation 400 of FIG. 1.

First, in operation S431, a circuit structure is obtained through a netlist to check a floating node. As described above, the netlist represents a connection relation between circuit elements included in a schematic circuit, a connection relation between functional blocks constituted by circuit elements, and node information according to a connection of circuit elements. The circuit structure is obtained through the netlist.

In operation S433, check control information to control a floating node check is obtained. The check control information includes information on a check start node and a check end node. For example, if information about a power supply node and a ground node is obtained through a netlist, a specific power supply node is designated as a check start node and a specific ground node is designated as a check end node through the check control information. The check control information also includes information to judge an error. For example, the check control information includes a judgment value to judge whether a node is a floating node or not, time information to designate a stabilizing time before judging whether a floating node is generated or not, and a judgment value to select one of floating nodes when a floating node is detected several times in one node.

In operation S435, a check target list is generated. The check target list means a list about a circuit node. The check target list includes node information, path information affecting a logical value of the node, and circuit element information included in the path. Also, the check target list is generated on a basis of a check start node and a check end node obtained through the check control information. The check target list will be in detail with reference to FIGS. 9 and 10.

In operation S437, a logical value included in the check target list and a logical value of gate node of transistor included in the check target list are obtained through a waveform generated after a circuit is simulated. As described above, a node value of waveform is represented by a logic "1", a logic "0", a logic "X" meaning an intermediate state, and a logic "Z" meaning a floating state.

In operation S439, a floating node check is performed on the check target list. The floating node check is performed by checking a waveform corresponding to a node included in the check target list. The floating node check method will be described in detail through FIG. 13.

Figure 9:
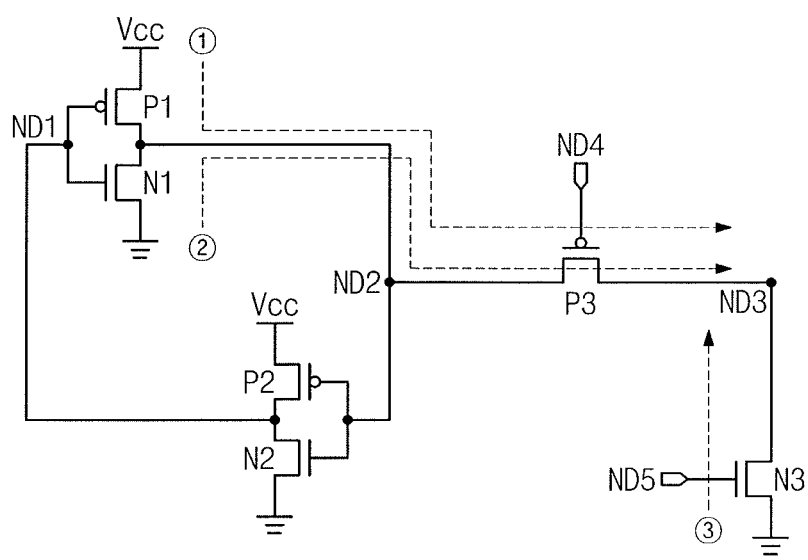

FIGS. 9 and 10 illustrate how a check target list generated in the check target list generation operation S433 of FIG. 8. Hereinafter, some embodiments for describing the inventive concept are provided and a circuit constituted by transistors is used to describe the floating node check method. Circuits that will be described in detail may include PMOS transistors or NMOS transistors. However, the inventive concept is not limited thereto.

Referring to FIG. 9, a check target circuit 200 includes a plurality of PMOS transistors (P1 through P3) and a plurality of NMOS transistors (N1 through N3). The transistors (i.e., PMOS transistors and NMOS transistors) of the check target list 200 are connected to one another through a plurality of nodes (ND1 through ND5). An interconnection relation of the circuit elements of the check target circuit 200 is obtained through a netlist as described above.

For brevity of description, it will be described that the third node ND3 among the nodes (ND1 through ND5) of the check target circuit 200 is generated as a check target list. First, a node of the circuit (for example, the third node ND3) is detected through a netlist. Specific information about the detected information (for example, path information affecting a logical value of node and element information included in the path information) is generated.

Referring to FIG. 9, a path affecting a logical value of the third node ND3 is represented by symbols ①-③. Path 1 is formed through the first PMOS transistor P1 and the third PMOS transistor P3. Path 2 is formed through the first NMOS transistor N1 and the third PMOS transistor P3. Path 3 is formed through the third NMOS transistor N3.

The source of the first PMOS transistor P1 is connected to a power supply Vcc, the drain of the first PMOS transistor P1 is connected to the second node ND2, and the gate of the first PMOS transistor P1 is connected to the first node ND1. The source of the third PMOS transistor P3 is connected to the second node ND2, the drain of the third PMOS transistor P3 is connected to the third node ND3, and the gate of the third PMOS transistor P3 is connected to the fourth node ND4.

Referring to FIG. 10, the check target list includes a node name of the third node ND3 and path information represented by symbols ①-③. The check target list includes circuit element information and node information of each of the paths (path 1 through path 3). The check target list includes the path information and the circuit element information. A check target list for checking a floating node in the same manner is generated. Hereinafter, an example that the floating node is generated is described in detail with reference to FIGS. 11A through 12C.

Firstly, an example of including PMOS transistors and NMOS transistors is described with reference to FIGS. 11A and 12A.

Figure 11A:
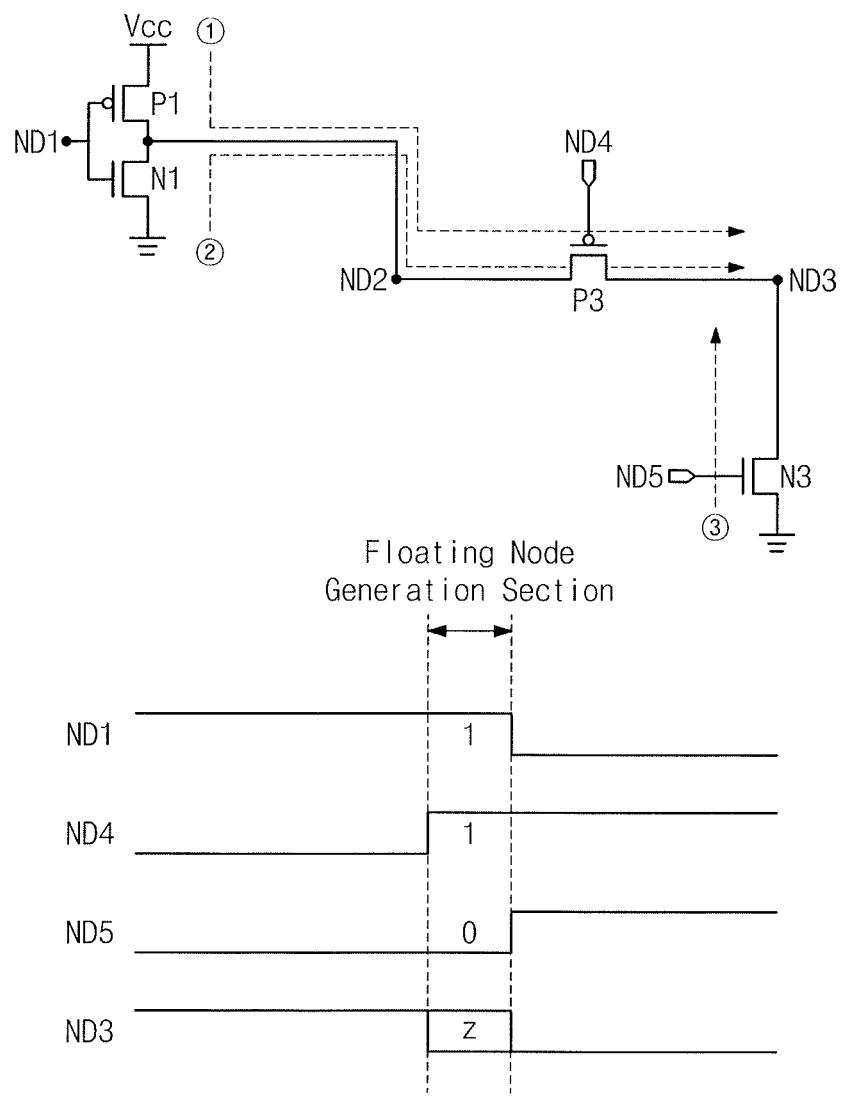
FIGS. 11A, 11B, and 11C illustrate examples of generation of floating node.

FIG. 11A illustrates an example of generation of floating node. For brevity of description, in FIG. 11A, a case that the third node ND3 of the check target list is in a floating state is described by an example. Assume that the third node ND3 has any logical state by the first PMOS transistor P1 and the third PMOS transistor P3 that are included in the path 1, the first NMOS transistor N1 and the third PMOS transistor P3 that are included in the path 2, and the third NMOS transistor N3 included in the path 3.

Path 1 is formed through the first PMOS transistor P1 and the third PMOS transistor P3. The source of the first PMOS transistor P1 is connected to the power supply Vcc, the drain of the first PMOS transistor P1 is connected to the second node ND2, and the gate of the first PMOS transistor P1 is connected to the first node ND1. The source of the third PMOS transistor P3 is connected to the second node ND2, the drain of the third PMOS transistor P3 is connected to the third node ND3, and the gate of the third PMOS transistor P3 is connected to the fourth node ND4. Path 2 is formed through the first NMOS transistor N1 and the third PMOS transistor P3. The source of the first NMOS transistor N1 is connected to a ground GND, the drain of the first NMOS transistor N1 is connected to the second node ND2 and the gate of the first NMOS transistor N1 is connected to the first node ND1. The source of the third PMOS transistor P3 is connected to the second node ND2, the drain of the third PMOS transistor P3 is connected to the third node ND3, and the gate of the third PMOS transistor P3 is connected to the fourth node ND4. Path 3 is formed through the third NMOS transistor N3. The source of the third NMOS transistor N3 is connected to a ground GND, the drain of the third NMOS transistor N3 is connected to the third node ND3, and the gate of the third NMOS transistor N3 is connected to the fifth node ND5.

As illustrated in FIG. 11A, when a logical value of the first node ND1 is a logic "1", a logical value of the fourth node ND4 is a logic "1", and a logical value of the fifth node ND5 is a logic "0", the third node ND3 is in a floating state. That is, even if the first PMOS transistor P1 and the first NMOS transistor N1 are turned off by the logic "1" of the first node ND1, if the third PMOS transistor P3 is turned off by the logic "1" of the fourth node ND4, and the third NMOS transistor N3 is turned off by the logic "0" of the fifth node ND5, the third node ND3 is in a floating state. At this time, the third node ND3 is a floating node.

The floating node may be generated due to a slope, delay, etc., of voltages applied to gates of the transistors P1, N1, P3, and N3. If a floating node is generated, it may cause abnormal operation. Also, if a generation time of the floating node is long, unnecessary power may be consumed. Thus, an error is detected through a circuit check and the detected error is corrected.

FIG. 12A illustrates conditions under which the third node ND3 in FIG. 11A becomes a floating node. Referring to FIG. 12A, logical values of the nodes ND1, ND4, and ND5 connected to gates of the transistors P1, N1, P3, and N3 affecting a logical state of the third node ND3 of FIG. 11A are illustrated.

If logical values of the nodes ND1, ND4, and ND5 respectively connected to gates of the transistors P1, N1, P3 and N3 affecting a logical state of the third node ND3 have the values illustrated in FIG. 12A, the third node ND3 is a floating node. That is, if the transistors P3 and N3 are turned off by logical values of the nodes ND4 and ND5 connected to gates of the transistors P3 and N3 respectively, the third node ND3 is in a floating state. Even though the transistors P1 and N1 are slightly or fully turned on by a logical value of the first node ND1 connected to gates of the transistors P1 and N1, if the transistor P3 is turned off by a logical value of the fourth node ND4 connected to a gate of the transistor P3 and the transistor N3 is turned off by a logical value of the fifth node ND5 connected to a gate of the transistor N3, the third node ND3 is in a floating state.

For example, as illustrated for a logical value 1 in FIG. 12A, when a logical value of the first node ND1 is a logic "1", a logical value of the fourth node ND4 is a logic "1", and a logical value of the fifth node ND5 is a logic "0", the transistors P3 and N3 are turned off and the third node ND3 is in a floating state. Also, the third node ND3 may be in a floating state by each of a logical value 2 and a logical value 3 of FIG. 12A.

Secondly, an example circuit including only PMOS transistors is described with reference to FIGS. 11B and 12B.

Figure 11B:
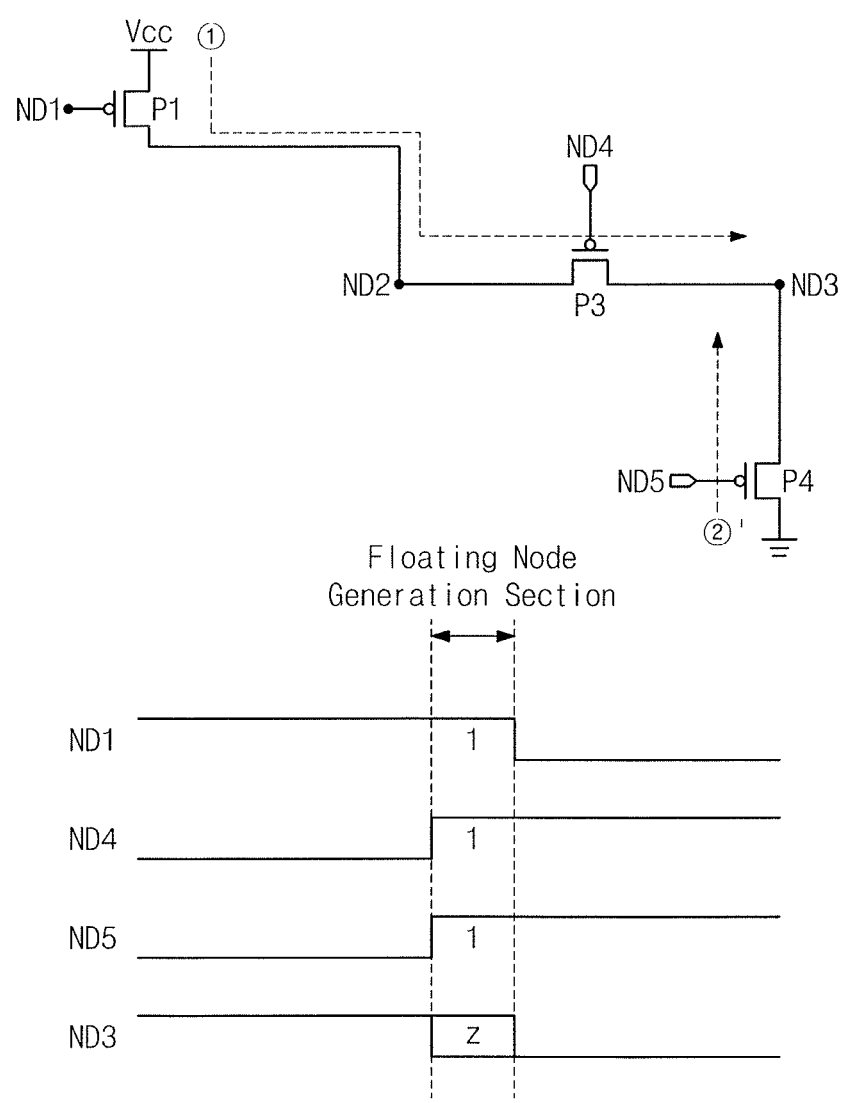

FIG. 11B illustrates an example of generation of floating node. For brevity of description, in FIG. 11B, a case that the third node ND3 of a circuit in which the third NMOS transistor N3 of FIG. 11A is replaced with the fourth PMOS transistor P4 and the first NMOS transistor N1 of FIG. 11A is removed is in a floating state is described by an example. Assume that the third node ND3 has any logical state by the first PMOS transistor P1 and the third PMOS transistor P3 included in path 1 and the fourth PMOS transistor P4 included in path 2'.

Path 1 is formed through the first PMOS transistor P1 and the third PMOS transistor P3. The source of the first PMOS transistor P1 is connected to the power supply Vcc, the drain of the first PMOS transistor P1 is connected to the second node ND2, and the gate of the first PMOS transistor P1 is connected to the first node ND1. The source of the third PMOS transistor P3 is connected to the second node ND2, the drain of the third PMOS transistor P3 is connected to the third node ND3, and the gate of the third PMOS transistor P3 is connected to the fourth node ND4. Path 2' is formed through the fourth PMOS transistor P4. The source of the fourth PMOS transistor P4 is connected to the third node ND3, the drain of the fourth PMOS transistor P4 is connected to a ground GND, and the gate of the fourth PMOS transistor P4 is connected to the fifth node ND5.

As illustrated in FIG. 11B, when a logical value of the first node ND1 is a logic "1", a logical value of the fourth node ND4 is a logic "1", and a logical value of the fifth node ND5 is a logic "1", the third node ND3 is in a floating state. That is, if the first PMOS transistor P1 is turned off by the logic "1" of the first node ND1, the third PMOS transistor P3 is turned off by the logic "1" of the fourth node ND4, and the fourth PMOS transistor P4 is turned off by the 1 logic "1" of the fifth node ND5, the third node ND3 is in a floating state. At this time, the third node ND3 is a floating node.

The floating node may be generated due to a slope, delay, etc., of voltages applied to gates of the transistors P1, P3, and P4. If a floating node is generated, it may cause abnormal operation. Also, if a generation time of the floating node is long, an unnecessary power may be consumed. Thus, an error is detected through a circuit check and the detected error is corrected.

FIG. 12B illustrates conditions under which a third node in FIG. 11B becomes a floating state. Referring to FIG. 12B, logical values of the nodes ND1, ND4, and ND5 respectively connected to gates of the transistors P1, P3, and P4 affecting a logical state of the third node ND3 of FIG. 11B are illustrated.

If logical values of the nodes ND1, ND4, and ND5 respectively connected to gates of the transistors P1, P3, and P4 affecting a logical state of the third node ND3 have the values illustrated in FIG. 12B, the third node ND3 is a floating node. That is, if the transistors P3 and P4 are turned off by logical values of the nodes ND4 and ND5 connected to gates of the transistors P3 and P4 respectively, the third node ND3 is in a floating state. Even if the transistor P1 is slightly or fully turned on by a logical value of the first node ND1 connected to a gate of the transistor P1, if the transistor P3 is turned off by a logical value of the fourth node ND4 connected to a gate of the transistor P3 and the transistor P4 is turned off by a logical value of the fifth node ND5 connected to a gate of the transistor P4, the third node ND3 is in a floating state. Also, even if the transistor P3 is slightly or fully turned on by a logical value of the fourth node ND4 connected to a gate of the transistor P3, if the transistor P1 is turned off by a logical value of the first node ND1 connected to a gate of the transistor P1 and the transistor P4 is turned off by a logical value of the fifth node ND5 connected to a gate of the transistor P4, the third node ND3 is in a floating state.

For example, as illustrated for a logical value 1 of FIG. 12B, when a logical value of the first node ND1 is a logic "1", a logical value of the fourth node ND4 is a logic "1", and a logical value of the fifth node ND5 is a logic "1", the transistors P1, P3, and P5 are turned off and the third node ND3 is in a floating state. Also, the third node ND3 may be in a floating state by each of logical values 2 through 5 of FIG. 12B.

Lastly, an example circuit including only NMOS transistors is described with reference to FIGS. 11C and 12C.

Figure 11C:
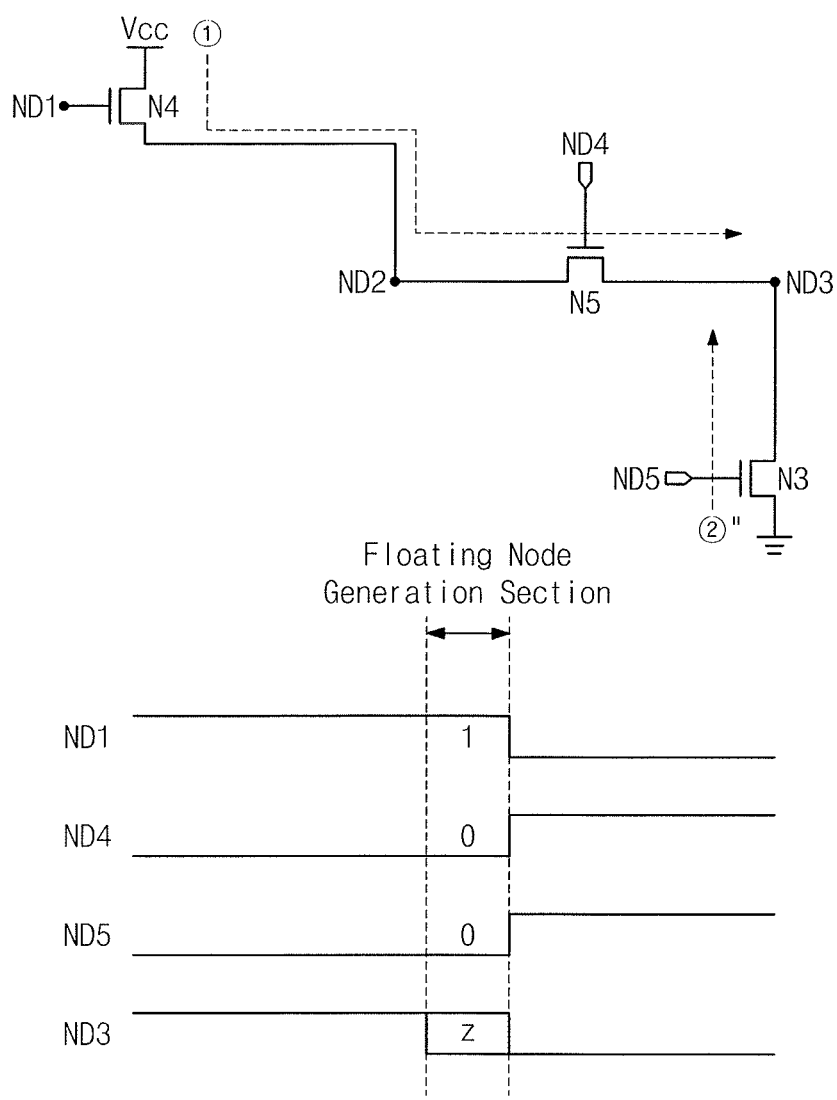

FIG. 11C illustrates an example of generation of a floating node. For brevity of description, in FIG. 11C, a case that the third node ND3 of circuit in which the first PMOS transistor P1 of FIG. 11A is replaced with the fourth NMOS transistor N4, the third PMOS transistor P3 of FIG. 11A is replaced with the fifth NMOS transistor N5, and the first NMOS transistor N1 of FIG. 11A is removed is in a floating state is described as an example. Assume that the third node ND3 has any logical state by the fourth NMOS transistor N4 and the fifth NMOS transistor N5 that are included in path 1 and the third NMOS transistor N3 included in path 2".

Path 1 is formed through the fourth NMOS transistor N4 and the fifth NMOS transistor N5. The drain of the fourth NMOS transistor N4 is connected to the power supply Vcc, the source of the fourth NMOS transistor N4 is connected to the second node ND2, and the gate of the fourth NMOS transistor N4 is connected to the first node ND1. The drain of the fifth NMOS transistor N5 is connected to the second node ND2, the source of the fifth NMOS transistor N5 is connected to the third node ND3, and the gate of the fifth NMOS transistor N5 is connected to the fourth node ND4. Path 2" is formed through the third NMOS transistor N3. The drain of the third NMOS transistor N3 is connected to the third node ND3, the source of the third NMOS transistor N3 is connected to a ground GND, and the gate of the third NMOS transistor N3 is connected to the fifth node ND5.

As illustrated in FIG. 11C, when a logical value of the first node ND1 is a logic "1", a logical value of the fourth node ND4 is a logic "0", and a logical value of the fifth node ND5 is a logic "0", the third node ND3 is in a floating state. That is, even if the fourth NMOS transistor N4 is turned on by the logic "1" of the first node ND1, if the fourth NMOS transistor N4 is turned off by the logic "0" of the fourth node ND4, and the third NMOS transistor N3 is turned off by the logic "0" of the fifth node ND5, the third node ND3 is in a floating state. At this time, the third node ND3 is a floating node.

The floating node may be generated due to a slope, delay, etc,. of voltages applied to gates of the transistors N4, N5, and N3. If a floating node is generated, it may cause abnormal operation. Also, if a generation time of the floating node is long, unnecessary power may be consumed. Thus, an error is detected through a circuit check and the detected error is corrected.

Figures 12C, 13:
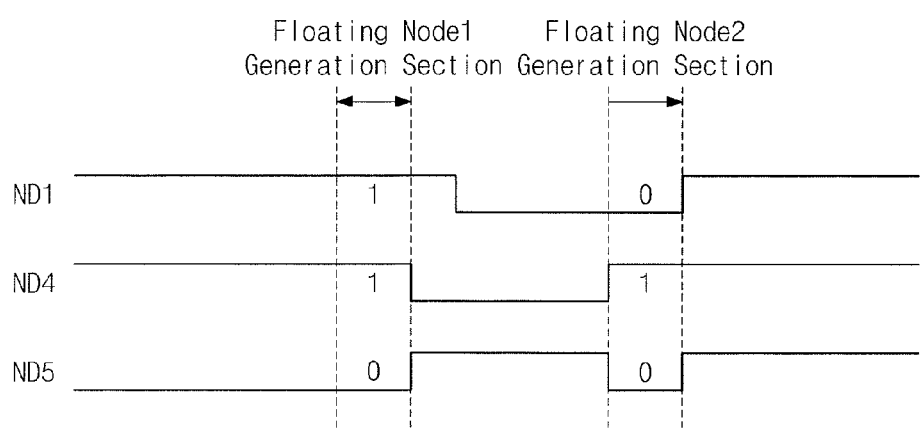
FIG. 12C illustrates conditions under which a third node in FIG. 11C becomes a floating node.
FIG. 13 illustrates a check method in the floating node check operation of FIG. 8.

FIG. 12C illustrates conditions under which a third node in FIG. 11C becomes a floating node. Referring to FIG. 12C, logical values of the nodes ND1, ND4, and ND5 respectively connected to gates of the transistors N3, N4 and N5 affecting a logical state of the third node ND3 of FIG. 11C are illustrated.

If logical values of the nodes ND1, ND4, and ND5 respectively connected to gates of the transistors N4, N5, and N3 affecting a logical state of the third node ND3 have the values illustrated in FIG. 12C, the third node ND3 is a floating node. That is, if the transistors N3 and N5 are turned off by logical values of the nodes ND5 and ND4 connected to gates of the transistors N3 and N5 respectively, the third node ND3 is in a floating state. Even if the transistor N4 is slightly or fully turned on by a logical value of the first node ND1 connected to a gate of the transistor N4, if the transistor N5 is turned off by a logical value of the fourth node ND4 connected to a gate of the transistor N5 and the transistor N3 is turned off by a logical value of the fifth node ND5 connected to a gate of the transistor N3, the third node ND3 is in a floating state. Also, even if the transistor N5 is slightly or fully turned on by a logical value of the fourth node ND4 connected to a gate of the transistor N5, if the transistor N4 is turned off by a logical value of the first node ND1 connected to a gate of the transistor N4 and the transistor N3 is turned off by a logical value of the fifth node ND5 connected to a gate of the transistor N3, the third node ND3 is in a floating state.

For example, as illustrated for a logical value 1 in FIG. 12C, when a logical value of the first node ND1 is a logic "1", a logical value of the fourth node ND4 is a logic "0" and a logical value of the fifth node ND5 is a logic "0", even if the transistor N4 is turned on, the transistors N5 and N3 are turned off and the third node ND3 is in a floating state. Also, the third node ND3 may be in a floating state by each of logical values 2 through 5 of FIG. 12C.

FIG. 13 illustrates a check method in the floating node check operation S439 of FIG. 8. For brevity of description, the check method in the floating node check operation S439 of FIG. 8 is described using the third node ND3 of FIG. 11A included in a check target list as an example. Referring to FIG. 13, among waveforms generated after simulating a circuit, a part of waveform applied to a gate of transistor affecting a logical state of the third node ND3 is illustrated.

In a floating node check operation S439 of FIG. 8, a floating node check may be performed by checking all the combinations of logical values making the third node ND3 a floating state in the waveform. That is, the floating node check operation means an operation of finding whether or not the nodes ND1, ND4, and ND5 connected to gates of transistors affecting a logical state of the third node ND3 have logical values (logical value 1 through logical value 3) illustrated in FIG. 12A.

In the floating node check operation S439, a condition of making one node a floating node may be detected several times. In this case, one of the conditions detected several times may be selected as a check result through the check control information obtained in the operation S433 in FIG. 8. Referring to FIG. 13, in a waveform, two floating nodes (floating node 1 and floating node 2) with respect to the third node ND3 are illustrated as being detected. In this case, any one of the floating node 1 and the floating node 2 may be selected as a floating node check result according to the check control information. In other words, once a node has been determined to match a logical value of the target check list, the checking may be stopped.

Although through FIGS. 11A through 13, a condition of making the third node ND3 a floating state and a method of checking a floating state of the third node ND3 are described as an example, in the same manner, an operation for checking a floating node may be applied to the nodes ND1 through ND5 of FIG. 9.

According to a circuit simulation method in accordance with one or more embodiments, the speed of circuit error check increases and various error checks may be performed. In contrast to using currently available analog circuit simulators, e.g., SPICE, to also check for errors, a circuit simulation method in accordance with one or more embodiments may use waveforms having discrete values to check various errors. Thus, one or more embodiments use an already generated netlist and a waveform having digital or discrete values, the speed of checking an error of circuit increases and various error checks may be performed.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A circuit simulation method for checking a circuit error using a circuit simulation tool and a schematic tool implemented by a circuit design apparatus, the method comprising:
   obtaining a netlist with respect to a designed circuit using the schematic tool;
   simulating an operation of the designed circuit using the netlist using the circuit simulation tool for displaying results of the simulation; and
   checking the designed circuit using the netlist using the circuit simulation tool,
   wherein checking the designed circuit includes:
   determining one or more waveforms of discrete values of elements in the designed circuit, and
   identifying at least one predetermined condition in the designed circuit based on the discrete values of the one or more waveforms, the discrete values determining one or more of a circuit path or a value of a node in the designed circuit corresponding to the at least one predetermined condition, and
   wherein the at least one predetermined condition includes a circuit path which consumes a power in an abnormal operation of the designed circuit, the circuit path formed by at least one transistor turned on based on one or more of the discrete values of the one or more waveforms.

2. The circuit simulation method as claimed in claim 1, wherein checking the designed circuit comprises:
   determining a structure of circuit through the netlist;
   obtaining check control information to control checking of the circuit; and
   generating a check target list based on the structure of the circuit and the obtained check control information;
   obtaining a logical value of node included in the check target list through the waveform; and
   checking existence of an error with respect to the check target list using the check control information and the waveform.

3. The circuit simulation method as claimed in claim 2, wherein the check target list comprises information about a power supply-ground path.

4. The circuit simulation method as claimed in claim 3, wherein the check target list comprises circuit element information and node information included in the power supply-ground path.

5. The circuit simulation method as claimed in claim 4, wherein checking the designed circuit with respect to the check target list comprises checking whether or not a direct current path corresponding to the circuit path is in the check target list, the direct circuit path including a path coupling a power supply to a ground.

6. The circuit simulation method as claimed in claim 5, wherein a circuit device included in the power supply-ground path comprises an NMOS transistor or a PMOS transistor, and wherein the discrete values include a logical value of a gate node of the transistor.

7. The circuit simulation method as claimed in claim 5, wherein checking the designed circuit with respect to the check target list comprises checking whether a combination of logical values that correspond to a direct current path in the check target list is in the waveform, wherein the discrete values include the logical values.

8. The circuit simulation method as claimed in claim 3, wherein the check target list comprises information about a node of the circuit.

9. The circuit simulation method as claimed in claim 8, wherein the check target list comprises path information affecting a logical value of the node and circuit element information included in the path.

10. The circuit simulation method as claimed in claim 9, wherein checking the designed circuit with respect to the check target list comprises checking whether a node included in the check target list is in a floating state or not.

11. The circuit simulation method as claimed in claim 10, wherein a circuit device included in the power supply-ground path comprises an NMOS transistor or a PMOS transistor and wherein the discrete values include a logical value of a gate node of the transistor.

12. The circuit simulation method as claimed in claim 10, wherein checking the error with respect to the check target list comprises checking whether a combination of logical values indicating a floating node in the check target list is in the waveform, wherein the discrete values include the logical values.

13. The circuit simulation method as claimed in claim 1, wherein the waveform includes logical values determining the value of the node of the designed circuit.

14. The circuit simulation method as claimed in claim 1, wherein the node value is a floating state of the node.

15. The circuit simulation method as claimed in claim 1, wherein the one or more waveforms are a digital waveform having a logic "1", a logic "0", a logic "X" which indicates an intermediate state, and a logic "Z" which indicates a floating state.

16. The circuit simulation method as claimed in claim 1, wherein the circuit path is formed when a gate node of at least one transistor in the designed circuit does not have a logic level "1" or a logic level "0".

17. The circuit simulation method as claimed in claim 1, wherein the circuit path is formed when a gate node of at least one transistor in the designed circuit has a logic "X" which indicates an intermediate state or a logic "Z" which indicates a floating state.

18. A circuit simulation method for checking a circuit error using a circuit simulation tool and a schematic tool implemented by a circuit design apparatus, the method comprising:
   obtaining a netlist comprising circuit device information of a designed circuit and connection information of the circuit device using the schematic tool;
   generating a check target list using the netlist;
   simulating an operation of the designed circuit using the netlist using the circuit simulation tool which displays results of the simulation;
   determining one or more waveforms including logical values of circuit elements of the designed circuit as a result of simulating; and
   checking at least one predetermined condition of the designed circuit using the circuit simulation tool based on the generated check target list and the logical values of the circuit elements included in the one or more waveforms, wherein the at least one predetermined condition includes a circuit path which consumes a power in an abnormal operation of the designed circuit, the circuit path formed by at least one transistor turned on based on one or more of the logical values of the one or more waveforms.

19. The circuit simulation method as claimed in claim 18, wherein checking the designed circuit includes checking whether a combination of logical values in the generated check target list corresponding to the at least one predetermined condition is in the waveform.

20. A circuit simulation method for checking a circuit error using a circuit simulation tool and a schematic tool implemented by a circuit design apparatus, the method comprising:

obtaining a netlist with respect to a designed circuit using the schematic tool;

simulating an operation of the designed circuit using the netlist using the circuit simulation tool which displays results of the simulation;

determining one or more waveforms having discrete values of elements in the designed circuit as a result of simulating; and checking at least one predetermined condition of the designed circuit using the waveforms using the circuit simulation tool, wherein the discrete values determining one or more of a circuit path or a value of a node in the designed circuit corresponding to the at least one predetermined condition, wherein the at least one predetermined condition includes a circuit path which consumes a power in an abnormal operation of the designed circuit, the circuit path formed by at least one transistor turned on based on one or more of the discrete values of the one or more waveforms.

21. The circuit simulation method as claimed in claim 20, further comprising:

generating a check target list using the netlist, wherein checking the at least one predetermined condition of the designed circuit includes determining whether the one or more waveforms have values corresponding to the at least one predetermined condition based on the generated check target list.

22. The circuit simulation method as claimed in claim 21, wherein the discrete values are logical values and comparing includes determining whether combinations of logical values in the generated check target list exist in the one or more waveforms.

23. The circuit simulation method as claimed in claim 22, further comprising stopping said determining when one or more of the waveforms include a combination of logical values in the generated check target list.

24. The circuit simulation method as claimed in claim 21, wherein the generated check target list includes information about the node or the circuit path of the designed circuit.

\* \* \* \* \*